United States Patent [19]
Draaijer

[11] Patent Number: 6,111,399
[45] Date of Patent: Aug. 29, 2000

[54] MEASUREMENT SYSTEM AND ANTENNA THEREFOR

[75] Inventor: Maurice H. J. Draaijer, Eindhoven, Netherlands

[73] Assignee: U.S. Philips Corporation, New York, N.Y.

[21] Appl. No.: 09/039,755

[22] Filed: Mar. 16, 1998

[30] Foreign Application Priority Data

Mar. 17, 1997 [EP] European Pat. Off. .............. 97200795

[51] Int. Cl.[7] ........................... G01R 31/02; G01R 29/08
[52] U.S. Cl. ................................ 324/96; 324/72
[58] Field of Search ............................... 324/96, 72, 133, 324/120; 250/227.14, 551

[56] References Cited

U.S. PATENT DOCUMENTS 3,750,017  7/1973  Bowman et al. ...................... 324/72
4,686,530  8/1987  Schneider et al. ...................... 324/120

*Primary Examiner*—Walter E. Snow
*Attorney, Agent, or Firm*—Leroy Eason

[57] ABSTRACT

A radiation measurement system includes a dipole antenna (4,18) for radiating an EM field in response to an electrical signal generated by an opto-electrical converter (12). The opto-electrical converter (12) is provided with an optical signal representing the EM field to be emitted. Optical signals avoid disturbance of the EM field by a coaxial cable required to feed the antenna. In order to obtain an ideal dipole antenna with well known radiation properties, an inner conductor (16) is used to couple the signal from the opto-electrical converter (12) to both halves (4,18) of a hollow dipole antenna. FIG. 1

4 Claims, 2 Drawing Sheets

MEASUREMENT SYSTEM AND ANTENNA THEREFOR

BACKGROUND OF THE INVENTION

1. Field of the Invention

The invention is related to a radiation measurement system comprising first conversion means with an electrical port and an optical port, the optical port being coupled to a first end of an optical fiber, a second end of the optical fiber being coupled to an optical port of second conversion means placed within a dipole antenna comprising two hollow conductors, the electrical port of the second converter being coupled to the dipole antenna.

The invention is also related to an antenna suitable for use in such a measurement system.

2. Description of the Related Art

A measurement system according to the preamble is known from U.S. Pat. No. 4,091,327.

Such measurement systems are used for accurate measurements in the EMC (Electro Magnetic Compatibility) field. Such measurements include the determination of the emission of spurious EM fields by all kinds of electric equipment, or the susceptibility of such equipment to external EM fields. In order to obtain meaningful results from such measurements, antennas having well known properties are required. To meet this requirement, often dipole antennas are used, because their behavior is well known. A problem is that the properties of the antenna can be disturbed by the cable used to connect the antenna to the test equipment, the balun used to connect the symmetric antenna to the asymmetric cable, and other peripherals surrounding the antenna.

To eliminate the disturbing influences of said cable it is proposed in the above mentioned US patent to use converter means having an electrical port and an optical port inside the hollow dipole antenna. The optical part is coupled via an optical fiber to converter means having an optical part and an electrical part. In said known measurement system, the converter means inside the dipole antenna is an electro-optical converter which converts the (amplified) signal received by the dipole antenna into an optical signal which is transmitted via the optical fiber to the test equipment. In said known arrangement the (electrical) symmetry is disturbed due to the wiring near the dipole gap for connecting the dipole to the amplifier present in one part of the dipole antenna. This will result in an asymmetric radiation pattern of the antenna.

SUMMARY OF THE INVENTION

It is an object of the present invention to provide a measurement system according to the preamble in which the antenna has a symmetric radiation pattern.

Therefor the measurement system according to the invention is characterized in that the hollow conductors comprise a coaxial inner conductor, and in that the electrical port of the second converter is coupled to the inner conductor and to the outer conductor, the inner conductor being coupled to the outer conductor.

By using a coaxial inner conductor to couple the converter means to the dipole antenna, it is obtained that the environment of the dipole gap becomes completely symmetrical, resulting in a symmetrical radiation pattern.

An embodiment of the invention is characterized in that the second converter is placed near the outer end of one of the hollow conductors.

By placing the second converter near the outer end of one of the hollow conductors, its disturbing influence on the region near the dipole gap is minimized.

A further embodiment of the invention is characterized in that the second converter comprises an optical to electrical converter being connected between one of the hollow conductors and the inner conductor.

By connecting the opto-electrical converter between one hollow conductor and the coaxial conductor it is obtained that a voltage is generated across the gap between the hollow conductors. If the coaxial conductor in the hollow conductor opposite to the hollow conductor containing the opto-electrical converter is not connected to said hollow conductor, still a voltage across the dipole gap will be generated due to the capacitance between the coaxial conductor and the hollow conductor.

A still further embodiment of the invention is characterized in that the optical to electrical converter comprises a photo diode, in that a first impedance element is coupled between the first hollow conductor and the inner conductor, and in that a second impedance element is coupled between the second hollow conductor and the inner conductor.

By connecting impedance elements between the inner conductor and the first hollow conductor and between the inner conductor and the second hollow conductor, it becomes possible to influence the radiation properties of the antenna as a function of the frequency. If resistive impedance elements are used it is possible to obtain a measurement system having a maximum bandwidth.

BRIEF DESCRIPTION OF THE DRAWING

The present invention will now be explained with reference to the drawings, showing in.

DESCRIPTION OF THE PREFERRED EMBODIMENTS

Figure 1:
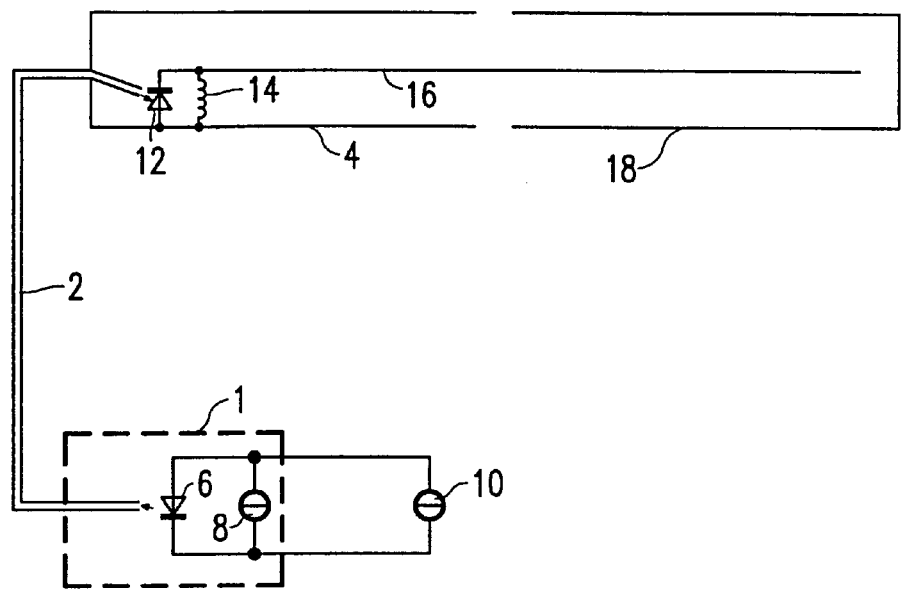
FIG. 1, a first embodiment of a system according to the invention having a transmit antenna.

In the measurement system according to FIG. 1, an RF signal source 10 is connected to an electrical port consisting of two inputs of first conversion means 1. The first conversion means 1 comprise an electrical optical converter 6, which can e.g. be a laser diode or a LED. The electrical-optical converter 6 is connected to a bias source 8. The optical port of the electrical-optical converter 6 e.g. a laser diode is coupled to a first end of an optical fiber 2.

A second end of the optical fiber 2 is coupled to an optical part of the second conversion means 12 inside a dipole antenna comprising hollow outer conductors 4 and 18 and inner conductor 16. The second conversion means 12 comprise an opto-electrical converter e.g. a photo diode or a photo transistor. A first terminal of the opto-electrical converter 12 is connected to the inner conductor 16 and to a first terminal of an inductance 14. A second terminal of the opto-electrical converter 12 is connected to the outer conductor 4 and to a second terminal of the inductance 14. The inner conductor 16 extends through most of the hollow conductors 4 and 18.

The RF signal generated by the RF source 10 is applied to the electro-optical converter 6 to obtain an amplitude modulated light signal at the output of said electro-optical converter 6. The current source 8 is present to provide a suitable bias current for obtaining a current bias level of the light signal. The bias level is chosen to obtain a modulation index smaller than 1 for the AM modulated light signal.

The amplitude modulated light signal is transmitted to the dipole antenna. In the dipole antenna the AM modulated light signal is converted into an RF signal by the opto-electrical converter 12. The RF signal is available as voltage between the inner conductor 16 and the outer conductor 4. The inductance 14 is present to provide a DC path for the opto-electrical converter. The voltage on the inner conductor 16 is coupled to the hollow conductor 18 by the capacitance between inner-conductor 16 and outer conductor 18. Consequently there will be an RF voltage between the hollow conductors 4 and 18. Due to the symmetric environment of the gap between the hollow conductor 4 and the hollow conductor 18 the system behaves as an ideal dipole antenna without disturbing elements such as wires etc.

Figure 2:
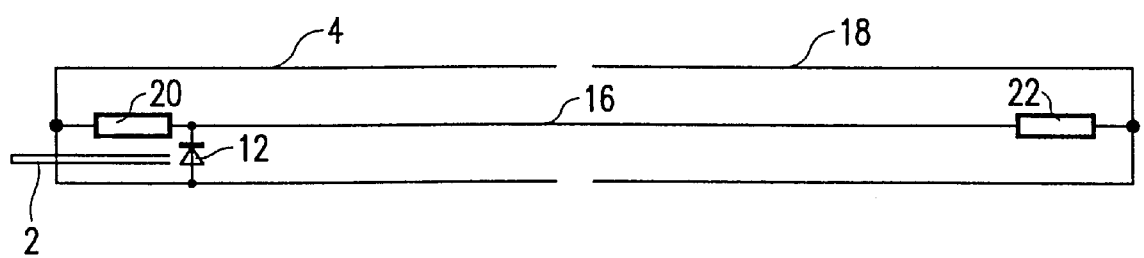
FIG. 2, a second embodiment of a system according to the invention having a transmit antenna.

In the dipole antenna according to FIG. 2 the inductor 4 has been replaced by an impedance element 20, e.g. a resistor. Also an impedance element 22 is connected between the inner conductor 16 and the hollow conductor 18. If the impedance elements 20 and 22 have an impedance equal to the characteristic impedance of the coaxial system constituted by the hollow conductors 4 and 18 and the center conductor 16, no reflection will take place within said coaxial system. This results in a maximum bandwidth of the measurement system.

Figure 3:
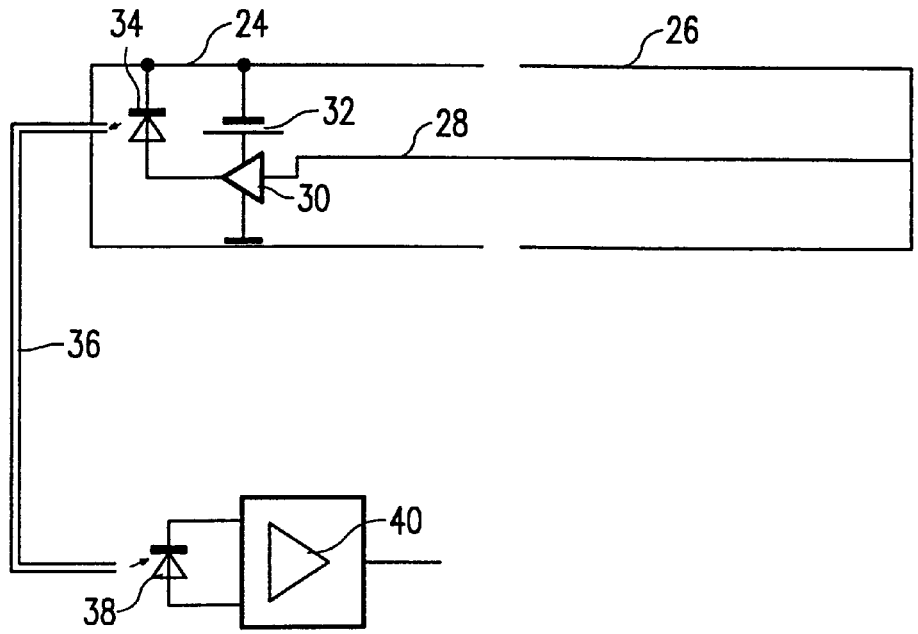
FIG. 3, a first embodiment of a system according to the invention using a receive antenna.

In the measurement system according to FIG. 3, a hollow dipole antenna is constituted by two hollow conductors 24 and 26. A center conductor 28 is connected to an end of the hollow conductor 26 and to an input of an amplifier 30. The amplifier 30 is powered by a battery 32 present within the hollow conductor 24. An output of the amplifier 30 is connected to second conversion means being here an electro-optical converter 34. The electro-optical converter 34 can be a laser diode or a LED.

The output part of the electro-optical converter 34 is coupled via a fiber 36 to an input part of the first conversion means being here an opto-electrical converter 38. The output of the opto-electrical converter 38 is connected to an input of an amplifier 40.

The measurement system according to FIG. 3 is intended for measuring the strength of the EM field emitted by a source. This type of measurements is useful for determining the level of spurious radiation of a device under text, e.g. a TV set, a personal computer or a microwave heating device. The emitted signal is received by the hollow dipole antenna constituted by the hollow conductors 24 and 26.

The received signal is conveyed by the coaxial system constituted by the conductors 24, 26 and 28 to the input of the amplifier 30. Due to the symmetric construction of the antenna in the vicinity of the dipole gap, the antenna will behave like an ideal dipole antenna with well known properties.

The signal amplified by the amplifier 30 is converted by the electro-optical converter 34 into an optical signal. Said optical signal is transmitted via the optical fiber 36 to the opto-electrical converter 38. The electrical output signal of the opt-electrical converter 38 is amplified by the amplifier 40. At the output of the amplifier 40 an electrical signal representing the EM field at the position of the dipole antenna is available.

Figure 4:
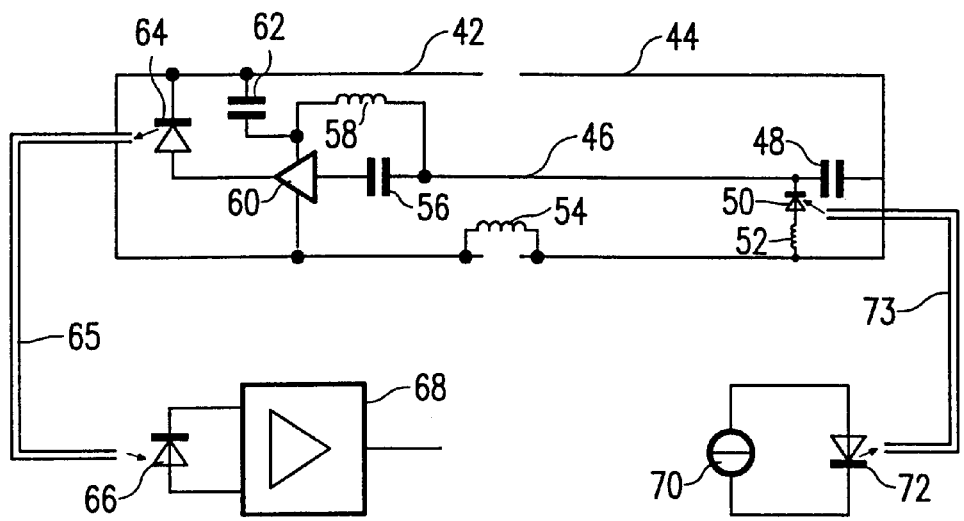
FIG. 4, a second embodiment of a system according to the invention using a receive antenna.

In the measurement system according to FIG. 4, a current source 70 is connected to an electro-optical converter 72. The optical output of the electro-optical converter 72 is coupled via an optical fiber 73 to an opto-electrical converter 50 within a hollow conductor 44. A first terminal of the opto-electrical converter 50 is connected to a first terminal of an inductor 52. A second terminal of the inductor 52 is connected to the hollow conductor 44.

A second terminal of the opto-electrical converter 50 is connected to the center conductor 46 and to a first terminal of a capacitor 48. A second terminal of the capacitor 48 is connected to the hollow conductor 44. The hollow conductor 44 is connected to the hollow conductor 42 via an inductor 54.

The center conductor 46 is connected to a first terminal of a capacitor 56 and to a first terminal of an inductor 58. A second terminal of the inductor 58 is connected to a power supply terminal of an amplifier 60 and to a first terminal of a capacitor 62. The second terminal of the capacitor 62 is connected to the hollow conductor 42.

The second terminal of the capacitor 56 is connected to an input of an amplifier 60. A second power supply terminal of the amplifier 60 is connected to the hollow conductor 42. The output of the amplifier 60 is connected to an electro-optical converter 64.

The optical port of the electro-optical converter 64 is coupled to a first end of an optical fiber 65.

The second end of the optical fiber 65 is coupled to an optical part of an opto-electrical converter 66. A first terminal of the opto-electrical converter 66 is connected to a first input terminal of an amplifier 68 and a second terminal of the opto-electrical converter 66 is connected to a second input terminal of the amplifier 68.

The embodiment of the invention according to FIG. 4 has the advantage that no battery is required to supply the amplifier 60 with DC power. The DC power is now provided by the opto-electrical converter 50. This opto-electrical converter 50 receives a light signal being generated by the electro-optical 72 converter via the optical fiber 73. The capacitor 48 is present to obtain exclusive AC coupling of the center conductor 46 to the hollow conductor 44. The inductor 52 is present to prevent signal current flowing through the opto-electrical converter.

The DC voltage generated by the opto-electrical converter 50 is present between the hollow conductor 44 and the center conductor 46. The inductor 54 is present to interconnect the hollow conductor 44 and the hollow conductor 42 to enable DC current to flow to the supply terminals of the amplifier 60, without short circuiting the signal voltage between the two hollow conductors.

The combination of inductor 58 and capacitor 62 is arranged to couple the DC voltage to the terminal of the amplifier 60, and to couple the signal voltage on the center conductor to the signal input of the amplifier 60. The capacitor 62 is present to couple the supply terminal of the amplifier 60 to the hollow conductor 42 for AC signals.

If sufficient space is available within the hollow dipole antenna, it is possible to place the opto-electric converter 50 in the same part of the dipole antenna. In such a case the cathode of the opto-electric converter can be directly connected to the positive supply terminal of the amplifier 60. Consequently, the inductors 52, 54 and 58 and the capacitor 56 can be dispensed with.

What is claimed is:

1. A radiation measurement system comprising first conversion means with an electrical port and an optical port, the optical port being coupled to a first end of an optical fiber, a second end of the optical fiber being coupled to an optical port of second conversion means placed within a dipole antenna comprising two hollow outer conductors, an electrical port of the second conversion means being coupled to the dipole antenna; characterized in that the system comprises a coaxial inner conductor which extends through each of the outer conductors, and the electrical port of the second conversion means is coupled to said inner conductor and to one of the outer conductors, the inner conductor also being coupled to said one of the outer conductors.

2. Measurement system according to claim 1, characterized in that the second conversion means is placed near an outer end of one of the outer conductors.

3. Measurement system according to claim 1, characterized in that the second conversion means is an optical-to-electrical converter which is connected between said one of the outer conductors and the inner conductor.

4. Measurement system according to claim 3, characterized in that the optical-to-electrical converter is a photo diode, a first impedance element is coupled between said one outer conductor and the inner conductor, and a second impedance element is coupled between the second outer conductor and the inner conductor.

* * * * *